(12) United States Patent
Rosen

(10) Patent No.: US 8,076,946 B1
(45) Date of Patent: Dec. 13, 2011

(54) LEAKAGE CALIBRATION

(75) Inventor: Eitan Rosen, Abirim (IL)

(73) Assignee: Marvell Israel (MISL) Ltd., Yokneam (IL)

(*) Notice: Subject to any disclaimer, the term of this patent is extended or adjusted under 35 U.S.C. 154(b) by 857 days.

(21) Appl. No.: 12/124,812

(22) Filed: May 21, 2008

Related U.S. Application Data

(60) Provisional application No. 60/939,196, filed on May 21, 2007.

(51) Int. Cl.
*G01R 35/00* (2006.01)

(52) U.S. Cl. ...................................... 324/601

(58) Field of Classification Search .................... 324/601
See application file for complete search history.

(56) References Cited

U.S. PATENT DOCUMENTS

| | | | |
|---|---|---|---|
| 7,446,549 B2 * | 11/2008 | Tomita et al. | 324/750.3 |
| 2005/0225909 A1 * | 10/2005 | Yoshizaki et al. | 361/42 |
| 2006/0206739 A1 * | 9/2006 | Kim et al. | 713/322 |

* cited by examiner

*Primary Examiner* — Amy He

(57) ABSTRACT

An integrated circuit and a method for efficiently operating integrated circuit devices. The integrated circuit includes an input that is configured to receive a first current which is representative of a leakage current drawn by leakage in a portion of the integrated circuit. The integrated circuit includes a leakage calibrator that is configured to compare the first current to a current required to perform a switching operation and output a value indicative of the leakage.

16 Claims, 6 Drawing Sheets

LEAKAGE CALIBRATION

CROSS REFERENCE TO PRIOR APPLICATIONS

This application claims priority and the benefit thereof from a U.S. Provisional Application No. 60/939,196 filed on May 21, 2007, which is hereby incorporated by reference for all purposes as if fully set forth herein.

BACKGROUND

1. Field

This disclosure relates to a system and a method for efficiently operating integrated circuit devices. More specifically, this disclosure relates to a method and a system for calibrating leakage currents in integrated circuit devices.

2. Related Art

Power consumption management is a concern in many electronic devices. Circuits that remain active, although not presently needed, may increase power consumption and/or raise an operating temperature which could have adverse effects. Moreover, many mobile electronic devices operate on batteries or other limited power sources. Some mobile electronic devices are configured to operate during periods of reduced activity in an idle mode to reduce power consumption and to extend battery life.

Commonly assigned, copending U.S. patent application Ser. No. 12/115,224, filed May 5, 2008, entitled "METHOD AND APPARATUS FOR ACTIVATING SLEEP MODE," which is expressly incorporated herein in its entirety, discloses a method and apparatus that controls an activity state of a functional block in an integrated circuit (IC). Circuits and methods may be required to estimate a current drawn by awakening a functional block in an IC, so that a net cost of switching off a circuit, which also requires power, can be ascertained.

SUMMARY

In one aspect of the disclosure, an integrated circuit is provided, comprising: an input configured to receive a first current which is representative of a leakage current drawn by leakage in a portion of the integrated circuit; and a leakage calibrator configured to compare the first current to a current required to perform a switching operation and output a value indicative of the leakage. The integrated circuit may further comprise a counter configured to receive a clock signal, wherein the value may be determined by the counter, which may be configured to receive a clock signal. The integrated circuit may further comprise a sleep activation circuit that may be configured to place a part of the integrated circuit in a sleep mode. The sleep activation circuit may receive the value. The value may be a numerical count.

The leakage calibrator may comprise a model load coupled to a first node, the model load may be configured to discharge a model leakage current at a first discharge rate; a leakage load coupled to a second node, the leakage load discharging a leakage current; and a controller coupled to the model load, the controller being configured to control the first discharge rate on a basis of the value. The leakage calibrator may further comprise a first transistor coupled to the first node and a power supply; and a second transistor coupled to the second node and the power supply. The model load may comprise a capacitor configured to store a charge; and an inverter configured to control the capacitor on a basis of a control signal.

According to another aspect of the disclosure, a method is provided for determining leakage in an integrated circuit. The method comprises receiving a first current that is representative of a leakage current drawn by leakage in a portion of the integrated circuit; comparing the first current to a current required to perform a switching operation; and outputting a value indicative of the leakage. The method may further comprise determining the value based on a clock signal. The value may be determined by counting a clock signal. The method may further comprise placing a part of the integrated circuit in a sleep mode. The integrated circuit may be placed in a sleep mode based on the value. The value may be a numerical count.

In yet another aspect of the disclosure, an integrated circuit is provided, which comprises a means for receiving a first current that is representative of a leakage current drawn by leakage in a portion of the integrated circuit; and a means for comparing the first current to a current required to perform a switching operation and outputting a value indicative of the leakage. The integrated circuit may further comprise a means for determining the value based on a clock signal. The integrated circuit may further comprise a means for placing a part of the integrated circuit in a sleep mode. The integrated circuit may be placed in a sleep mode based on said value. The value may be a numerical count.

Additional features, advantages, and embodiments of the disclosure may be set forth or apparent from consideration of the following detailed description, drawings, and claims. Moreover, it is to be understood that both the foregoing summary of the disclosure and the following detailed description set forth examples and are intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION

Figure 1:
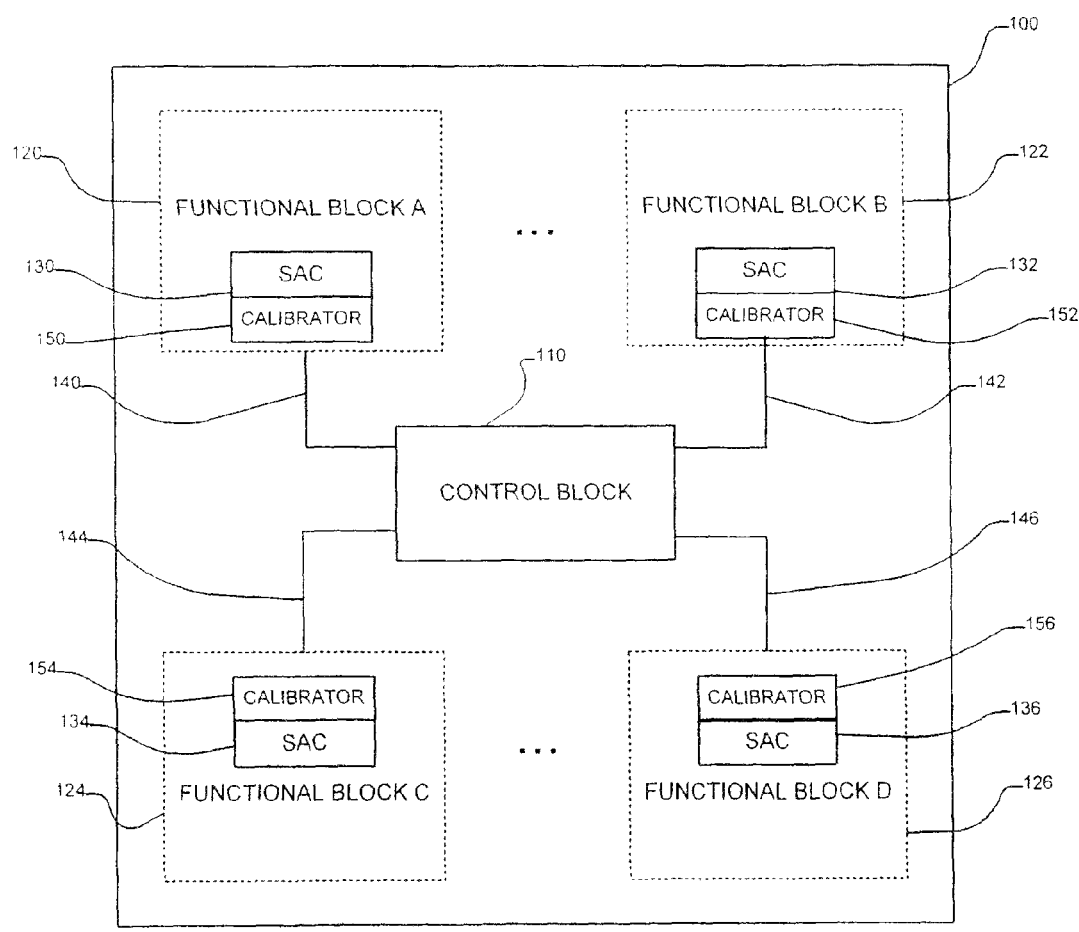
FIG. 1 shows an example of an electronic device configured with sleep activation circuits (SACs) and calibrators, in accordance with an embodiment of the disclosure.

The embodiments of the disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure teaching principles of embodiments described herein. The examples used herein are intended merely to facilitate an understanding of ways in which embodiments of the disclosure may be practiced and to further enable those of skill in the art to practice the embodiments of the disclosure. Accordingly, the examples and embodiments herein should not be construed as limiting the scope of the disclosure, which is defined solely by the appended claims and applicable law. Moreover, it is noted that like reference numerals represent similar parts throughout the several views of the drawings.

According to an aspect of the disclosure, the current consumption of an integrated circuit (IC) may be reduced and its performance may be improved while reducing the power leakage, for example, using circuits and methods disclosed in Applicant's copending, commonly assigned U.S. patent application Ser. No. 12/115,224, filed May 5, 2008, which is expressly incorporated herein by reference in its entirety. A sleep mode for a functional block in an IC may be adjusted on a basis of a calibration of the leakage power of the IC functional block with the power and latency requirements associated with putting the IC functional block to sleep, including power and latency requirements for awakening the IC functional block from sleep.

FIG. 1 shows an example of an electronic device 100 employing sleep activation circuits (SACs) and calibrators in accordance with an embodiment of the disclosure. The electronic device 100 may be any type of system, a component or module of a system, a module of a component, a component of a module, a microchip of a module or component, a logic block of a microchip, and the like. However, it is noted that the electronic device 100 may be any type of suitable electronic device and that it may include any number of components or functional blocks. For example, the electronic device 100 may be a microchip (e.g. a microprocessor, a memory chip or the like), a mobile communication device (e.g., a cellular phone, a personal data assistant (PDA) or the like), a mobile gaming device (e.g., Sony™ PlayStation Portable™), a personal computer (PC) (e.g., a desktop, a laptop, a portable computer or the like), a computer network (e.g., a home network, a business network, an Internet component or the like), a home appliance (e.g., a telephone, a television, an audio system, a set-top box, a camera, a camcorder and the like), a security system, broadcasting equipment, or the like.

In an embodiment, the electronic device 100 may include a control block 110, a plurality of functional blocks 120, 122, 124, 126, a plurality of SACs 130, 132, 134, 136, a plurality of signal lines 140, 142, 144, 146 and a plurality of calibrators 150, 152, 154, 156. The control block 110 may be coupled to and configured to control the functional blocks 120, 122, 124, 126. For example, the control block 110 may generate controls signals to the functional blocks 120, 122, 124, 126 via the signal lines 140, 142, 144, 146. Each of the functional blocks 120, 122, 124, 126 may be any of a component or module of an electronic device, a module of a component, a component of a module, a microchip of a module or a component, a logic block of a microchip, a sub-block of a functional block of a microchip and the like for example, without limitation thereto, a cache memory, an adder circuit, a sub-traction circuit, a multiplier or any other circuit or block including a plurality of circuits. It is noted that the functional blocks 120, 122, 124, 126 may comprise any conceivable electronic circuit that may be turned on and off and, hence, benefit from the power saving scheme constructed according to the teaching principles of the disclosure. For example, the functional block may be one of the micro-blocks in a microcircuitry, one of the logic blocks in a microchip, one of the memory blocks in a memory device, a microchip of a cellular phone or the like.

In an embodiment, the SACs 130, 132, 134, 136 may be provided to the functional blocks 120, 122, 124, 126 on a "one-on-one" basis to individually control the functional blocks 120, 122, 124, 126. The SACs 130, 132, 134, 136 may receive a calibration signal (or leakage indication signal) from the calibrators 150, 152, 154, 156, respectively, which is indicative of a level of leakage of the respective functional blocks 120, 122, 124, 126. The SACs 130, 132, 134, 136 may be physically located within the functional blocks 120, 122, 124, 126, respectively, as shown in FIG. 1. For example, in the case where the electronic device 100 is a microchip and the functional block 120 is a logic block, the SAC 130 may be implemented as a gate level logic within the functional block 120. However, the SACs 130, 132, 134, 136 may not be physically confined within the functional blocks 120, 122, 124, 126, respectively. For example, when the functional blocks 120, 122, 124, 126 are microchips mounted on a printed circuit board (PCB), each of the SACs 130, 132, 134, 136 may be incorporated in the control block 110, which may be a control module or a controller chip. The SACs 130, 132, 134, 136 may each be configured as the SACs disclosed in the copending U.S. patent application Ser. No. 12/115,224.

Further, the calibrators 150, 152, 154, 156 may be provided to the functional blocks 120, 122, 124, 126 on a "one-on-one" basis to individually control the functional blocks 120, 122, 124, 126. The calibrators 150, 152, 154, 156 may be physically located within the functional blocks 120, 122, 124, 126, respectively, as shown in FIG. 1. For example, in the case where the electronic device 100 is a microchip and the functional block 120 is a logic block, the calibrator 150 may be implemented as a gate level logic within the functional block 120. However, the calibrators 150, 152, 154, 156 may not be physically confined within the functional blocks 120, 122, 124, 126, respectively. For example, when the functional blocks 120, 122, 124, 126 are microchips mounted on a printed circuit board (PCB), each of the calibrators 150, 152, 154, 156 may be incorporated in the control block 110, which may be a control module or a controller chip.

Figure 2:
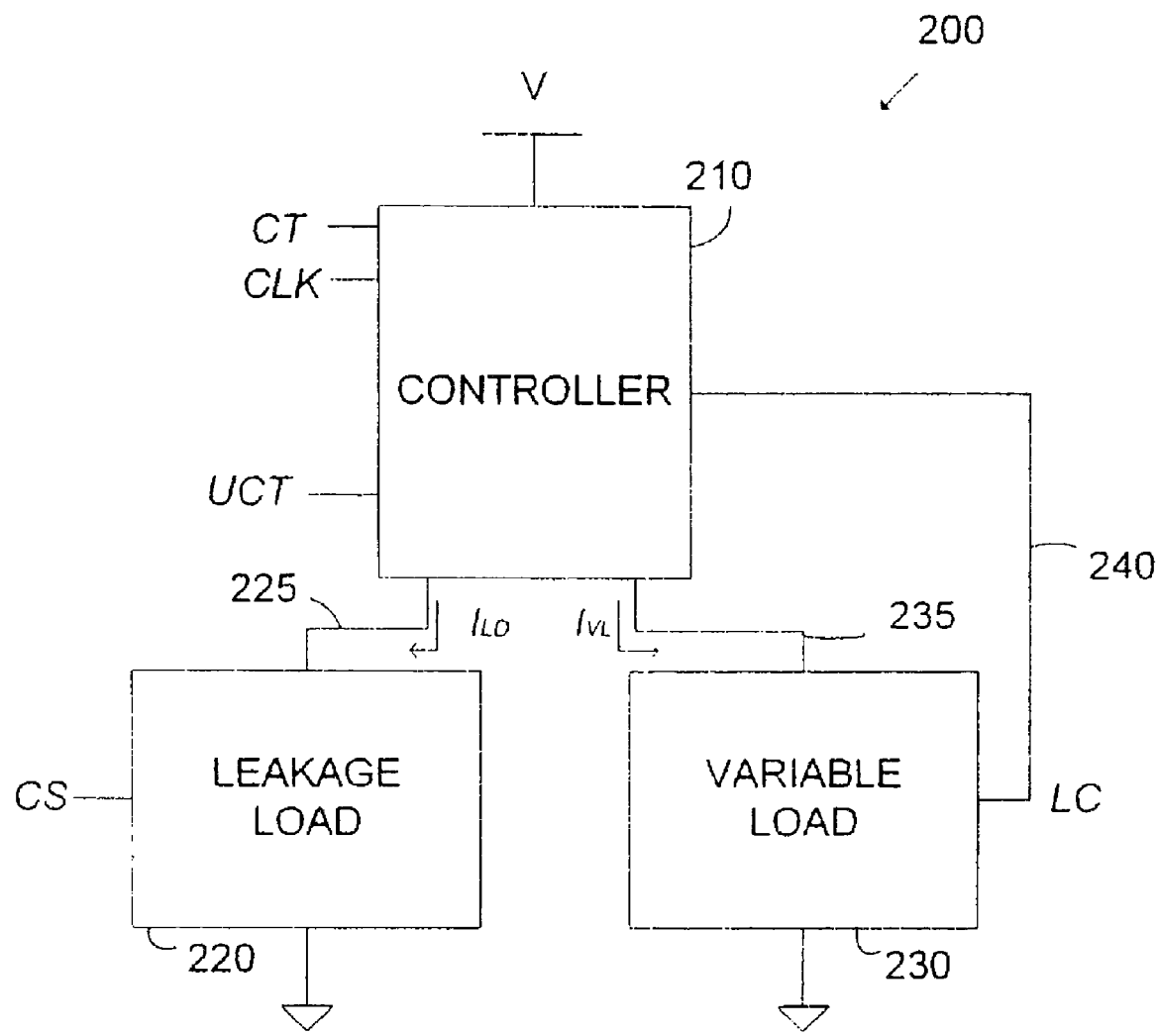
FIG. 2 shows an example of a leakage calibration system, according to an embodiment of the disclosure.

FIG. 2 shows an example of a leakage calibration system (LCS) 200 that may be used in any one or more of the calibrators 150, 152, 154, 156, according to an embodiment of the disclosure. The LCS 200 includes a controller 210, at least one leakage load 220 and a variable load 230. The controller 210, which may include a power control logic (not shown) and a counter (not shown), includes an input that is connected to a power supply node V and a plurality of outputs that are connected to the leakage load 220 and the variable load 230 through a plurality of lines 225, 235. The controller 210 also includes inputs for receiving a count signal CT and a clock signal CLK. The controller 210 further includes an output update count signal UCT, where the update count signal UCT may be generated on a basis of a comparison between a discharge rate of the leakage load 220, which is representative of a particular leaky IC functional block, and a discharge rate of the variable load 230, which is representative of the current consumed or spent when putting the particular leaky IC functional block (not shown) to sleep. The controller 210 also includes an output for controlling the variable load 230 through a control line 240. The variable load 230 is configured such that its discharge rate is smaller than the discharge rate of the leakage load 220.

The controller 210 may be configured to compare the current $I_{LD}$ that is discharged by the leakage load 220 through the line 225 with the current $I_{VL}$ that is discharged by the variable load 230 through the line 235. On a basis of the comparison, the controller 210 provides a load control signal LC to the variable load 230 through a line 240. The load control signal LC causes the variable load 230 to increase (or decrease) the current discharged through the variable load 230 by, for example, switching more load capacitors on or off in order to vary the discharged current $I_{VL}$.

The leakage load 220 includes an input for receiving the current signal $I_{LD}$ on the line 225 from the controller 210. Depending on the size of the functional block and/or the leakage characteristics of the functional block to be calibrated, additional leakage loads (not shown) may be connected to the controller 210. For example, the larger or the leakier the IC functional block, the greater the number of leakage loads that should be connected to the controller 210. The additional leakage loads may be selectively connected to the controller 210 (e.g., in parallel with the leakage load 220) through, for example, one or more switches (not shown).

The variable load 230 includes an input for receiving the current signal $I_{VL}$ on the line 235 and the control signal LC from the controller on the line 240. The variable load 230 may be configured to discharge varying amounts of currents on a basis of the received control signal LC. Further, the variable load 230 may include, for example, a capacitive load in which the discharge rate may be controlled. Depending on the sleep mode characteristics of the particular IC functional block to be calibrated, additional variable loads (not shown) may be connected to the controller 210. For example, the larger the capacitive effect or the greater the sleep latency of the IC functional block, the greater the number of variable loads that should be connected to the controller 210. The additional variable loads may be selectively connected to the controller 210 (e.g., in parallel with the variable load 230), through, for example, one or more switches (not shown).

Figure 3:
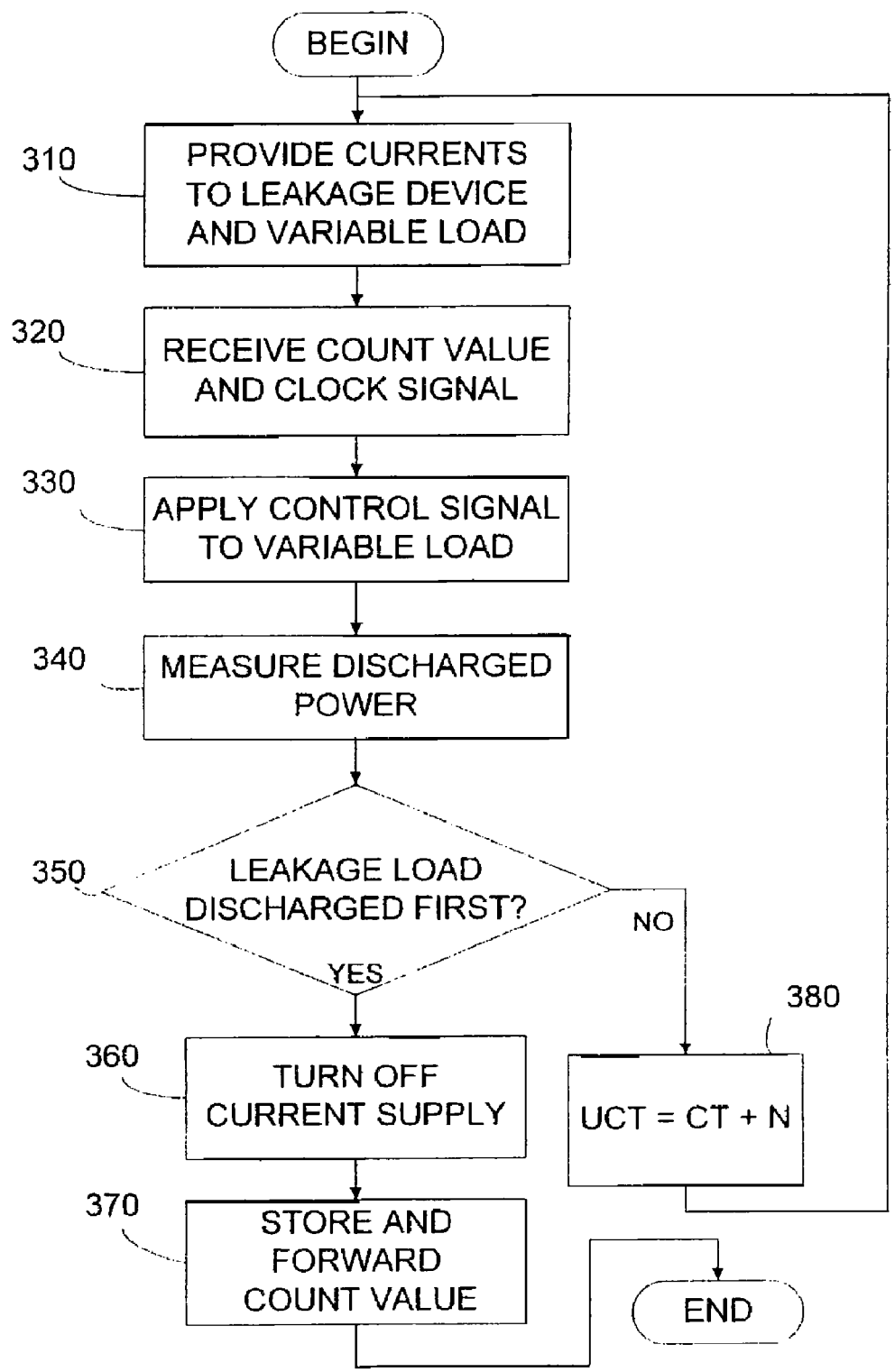
FIG. 3 shows an example of a process for calibrating leakage in the leakage calibration system shown in FIG. 2, according to an embodiment of the disclosure.

FIG. 3 shows an example of a process for calibrating power leakage in the LCS 200 shown in FIG. 2.

Referring to FIGS. 2 and 3, the controller 210 is enabled and a current $I_{TOTAL}$ is drawn from the power supply node V through the controller 210, which then supplies a current $I_{LD}$ to the leakage load 220 through the line 225 and a current $I_{VL}$ to the variable load 230 through the line 235 (Step 310). Further, a count value CT and a clock signal CLK are received from, e.g., a sleep activation controller (such as, e.g., the sleep activation controller (SAC) disclosed in the copending U.S. application Ser. No. 12/115,224, filed May 5, 2008) (Step 320). On a basis of the received signals CT and CLK, a load control signal LC is generated and supplied to the variable load 230 (Step 330). The currents $I_{LD}$ and $I_{VL}$ that are discharged through the leakage load 220 and the variable load 230, respectively, are compared (Step 340). If the rate of discharge of the current $I_{LD}$ through the leakage load 220 is greater than the rate of discharge of the current $I_{VL}$ through the variable load 230 ("YES" at Step 350), then an internal control logic (not shown) is enabled and the power supply from the node V is terminated (Step 360). The count value CT is saved as an updated count value UCT and forwarded to, for example, the sleep activation controller for use in determining a timing schedule for placing the particular IC functional block to sleep (Step 370). In other words, the calibrated UCT value will be forwarded to the sleep activation controller, which may then use the CT value as an input to a counter in determining when to place a particular functional block of the IC to sleep.

However, if the rate of discharge of the current $I_{LD}$ through the leakage load 220 is lower than the rate of discharge of the current $I_{VL}$ through the variable load 230 ("NO" at Step 350), then the count value CT is incremented by N and saved as the updated count value UCT, where N is a positive non-zero integer (Step 380) and the process is repeated with the new count value UCT (i.e., Step 310 to Step 350). The value assigned to N may depend on, for example, but is not limited to, a speed at which it may be desirable for the LCS 200 to calibrate the variable load 230 to the leakage loads 220.

While the above example of a process for calibrating power leakage in the LCS 200 shown in FIG. 1 is described with an incremental counter control (Step 380), it is understood that, alternatively, in response to a determination that the leakage load 220 discharges before the variable load 230 ("YES" at Step 360), the count value CT may be decremented by N (i.e., UCT=CT−N) at Step 360 and the process of Steps 310 to 350 repeated with the updated count value UCT.

Figure 4:
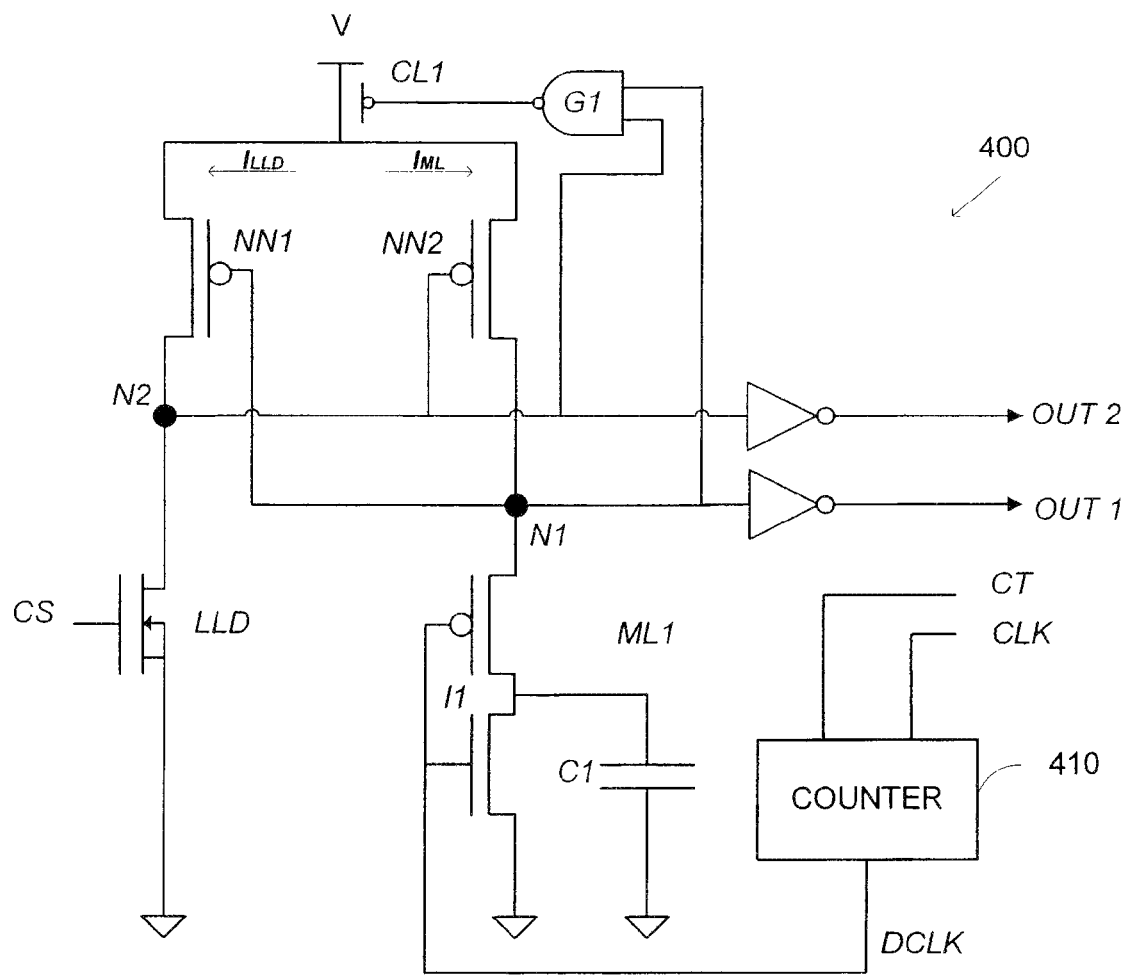
FIG. 4 shows an example of a leakage calibration circuit, according to an embodiment of the disclosure.

FIG. 4 shows an example of a leakage calibration circuit (LCC) 400, configured in accordance with an embodiment of the disclosure. The LCC 400 may include a pair of transistors NN1, NN2, a pair of nodes N1, N2, a leaky load LLD, a model load ML1, a counter 410, a logic gate G1 (such as, e.g., an AND logic gate) and a control logic CLI. The model load ML1 may include an inverter I1 and a capacitor C1, which may be configured to store an electrical charge that is representative of the electrical charge lost when entering sleep mode for a particular functional block in an IC to be calibrated. The transistors NN1, NN2, the leaky load LLD, the inverter I1 and the control logic CL1 may include, for example, but are not limited to, metal-oxide-semiconductor-field-effect transistors (MOSFETS). The transistors NN1, NN2 may be, for example, n-channel type MOSFET transistors. Further, the model load ML1 may be configured such that the discharge rate of the current flowing through the model load ML1 is greater than the discharge rate of the current flowing through the leaky load LLD.

Referring to FIG. 4, a source terminal of the transistor NN1 is coupled to a power supply V (such as, e.g., +1.0V) through the control logic CL1. A drain terminal of the transistor NN1 is coupled to the second node N2. A gate terminal of the transistor NN1 is coupled to the node N1, which is connected to the model load ML1, an input of the gate G1 and an output OUT1. The node N1 has a voltage potential $V_{N1}$. As mentioned above, the model load ML1 may include an inverter I1 and a capacitor C1, which is driven by the inverter I1. The model load ML1 is representative of the charge that may be consumed by putting a particular leaky IC functional block to sleep. Both nodes N1 and N2 are pre-charged to the supply value prior to each calibration step (operation) by a plurality of P-type devices (not shown) controlled by the controller.

During operation of the LCC 400, the voltage potential $V_{N1}$ at the node N1 varies as a function of the discharge rate of the current $I_{ML}$. For example, when the current $I_{ML}$ is discharged through the model load ML1, the voltage potential $V_{N1}$ may drop below a predetermined threshold voltage $V_T$, where $V_T$ may be, e.g., the voltage at which the gate G1 is enabled. In this instance, when the voltage potential $V_{N1}$ drops below the threshold voltage $V_T$, the corresponding input to the gate G1 drops below the threshold voltage $V_T$ and the output of the gate G1 toggles from a low value to a high value, thereby switching the control logic CL1 OFF.

It is noted that, depending on the size of the IC functional block undergoing calibration and/or the leakage characteristics of the IC functional block, additional capacitors (not shown) may be connected to the node N1. The additional capacitors may be selectively connected to the node N1 (e.g., in parallel with the capacitor C1) through, for example, one or more transistor switches (not shown).

Further, a source terminal of the transistor NN2 is also coupled to the power supply V through the control logic CL1. A drain terminal of the transistor NN2 is coupled to the node N1. A gate terminal of the transistor NN2 is coupled to the node N2, which is connected to the leaky load LLD, a second input of the gate G1 and an output OUT2. The node N2 has a voltage potential $V_{N2}$. The leaky load LLD, which may be controlled by a control signal CS1, is representative of the particular leaky IC functional block that is undergoing calibration.

During operation of the LCC 400, the voltage potential $V_{N2}$ at the node N2 varies as a function of the discharge rate of the current $I_{LLD}$ that is discharged through the leaky load LLD. For example, when the current $I_{LLD}$ is discharged through the leaky load LLD, the voltage potential $V_{N2}$ may drop below the predetermined threshold voltage $V_T$. In the instance when the voltage potential $V_{N2}$ drops below the threshold voltage $V_T$, the corresponding input to the gate G1 will drop below the threshold voltage $V_T$ and the output of the gate G1 will toggle from the low value to the high value, thereby switching the control logic CL1 OFF.

Again, it is noted that, depending on the size of the IC functional block that is undergoing calibration and/or the leakage characteristics of the IC functional block, additional leaky loads LLDS (not shown) may be connected to the node N2. The additional leakage loads (not shown) may be selectively connected to the node N2 (e.g., in parallel with the leaky load LLD) through, for example, one or more transistor switches (not shown).

As mentioned above, the nodes N1 and N2 are connected to the inputs of the logic gate G1, which may be configured to output a low value control logic signal to the control logic CL1 when both of the voltages $V_{N1}$ and $V_{N2}$ have values above the threshold voltage $V_T$. Hence, the control logic CL1 may continue to provide power to the leaky load LLD and the model load ML1 until either of the currents $I_{LLD}$ or $I_{ML}$ have discharged, at which point the operation will have completed. Further, the voltages $V_{N1}$ and $V_{N2}$ may be provided through the pair of respective outputs OUT1 and OUT2 to a controller 420 (shown in FIG. 5).

As shown in FIG. 4, an output of the counter 410 may be connected to the gate terminals of the inverter I1 of the model load ML1 to controllably drive the inverter I1. For example, the counter 410 may control the current discharged through the model load ML1 by controlling the frequency of the signal driving the gate of the inverter I1. The counter 410 may be configured to receive an initial count value CT and a clock signal CLK. On a basis of the received count value CT and the clock signal CLK, the counter 410 may output a modified clock signal DCLK to the inverter I1. The modified clock signal DCLK may be generated by dividing the received clock signal CLK by a predetermined value, such as, for example, but not limited to, 1, 2, 3, 4, 5, 6, or any other appropriate value, depending on the particular application, as will be appreciated by those skilled in the art, without departing from the scope or spirit of the disclosure.

The counter 410 may include a sleep activation counter (SAC), like the SAC counter described in the copending, commonly assigned U.S. patent application Ser. No. 12/115,224, filed May 5, 2008, the description of which is expressly incorporated herein by reference in its entirety.

Alternatively, the counter 410 may include a conventional counter that is capable of receiving the count signal CT and the clock signal CLK, and outputting the modified clock signal DCLK.

Figure 5:
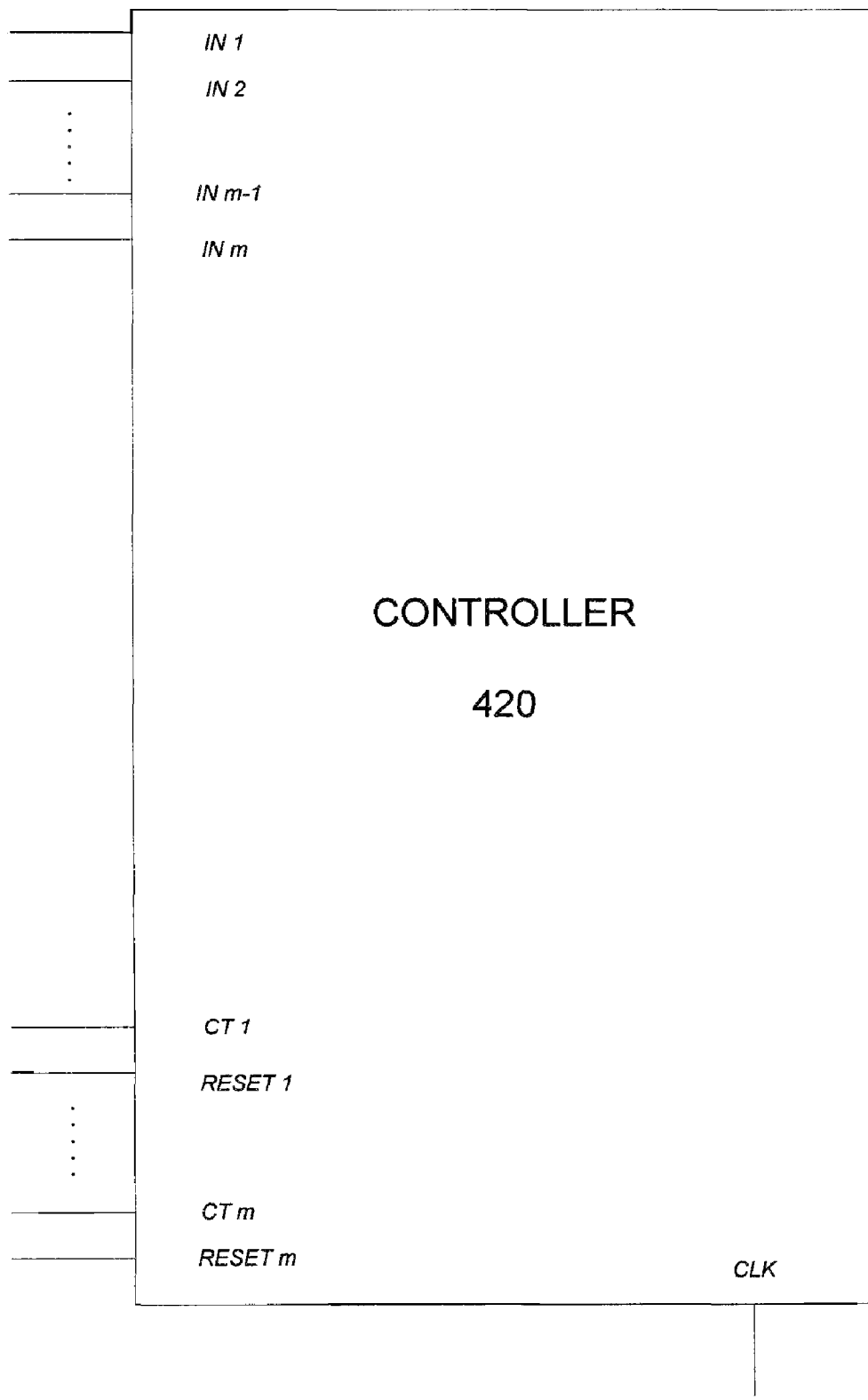
FIG. 5 shows an example of a controller that may be used with the leakage calibration circuit shown in FIG. 4, according to an embodiment of the disclosure.

FIG. 5 shows an example of a controller 420 that may be used with the LCC 400 shown in FIG. 4, according to an embodiment of the disclosure.

The controller 420 may be configured to include a plurality of inputs, including IN1, IN2, ... $IN_{m-1}$, $IN_m$, and CLK, and a plurality of outputs, including CT, $RESET_1$, ... $CT_m$, $RESET_m$, where m is a positive, non-zero, even-numbered integer value. The plurality of inputs IN1, IN2, ... $IN_{m-i}$, $IN_m$, and the plurality of outputs CT, $RESET_1$, ... $CT_m$, $RESET_m$ may be coupled to a plurality of logic calibration circuits, like the LCC 400 shown in FIG. 4. In this regard, the controller 420 may be coupled to m/2 leakage calibration circuits. The number m/2 of leakage calibration circuits that the controller 420 may be coupled to may depend on, for example, the leakage properties of functional blocks on a particular IC to be calibrated, the size of the particular IC, a temperature condition of the particular IC, or the like, as those skilled in the art would readily appreciate.

For example, the inputs IN1 and IN2 of the controller 420 may be coupled to the outputs OUT1 and OUT2, respectively, of the LCC 400 (shown in FIG. 4). The outputs CT and $RESET_1$ of the controller 420 may be coupled to the counter 410 and a RESET input (not shown) of the LCC 400.

Figure 6:
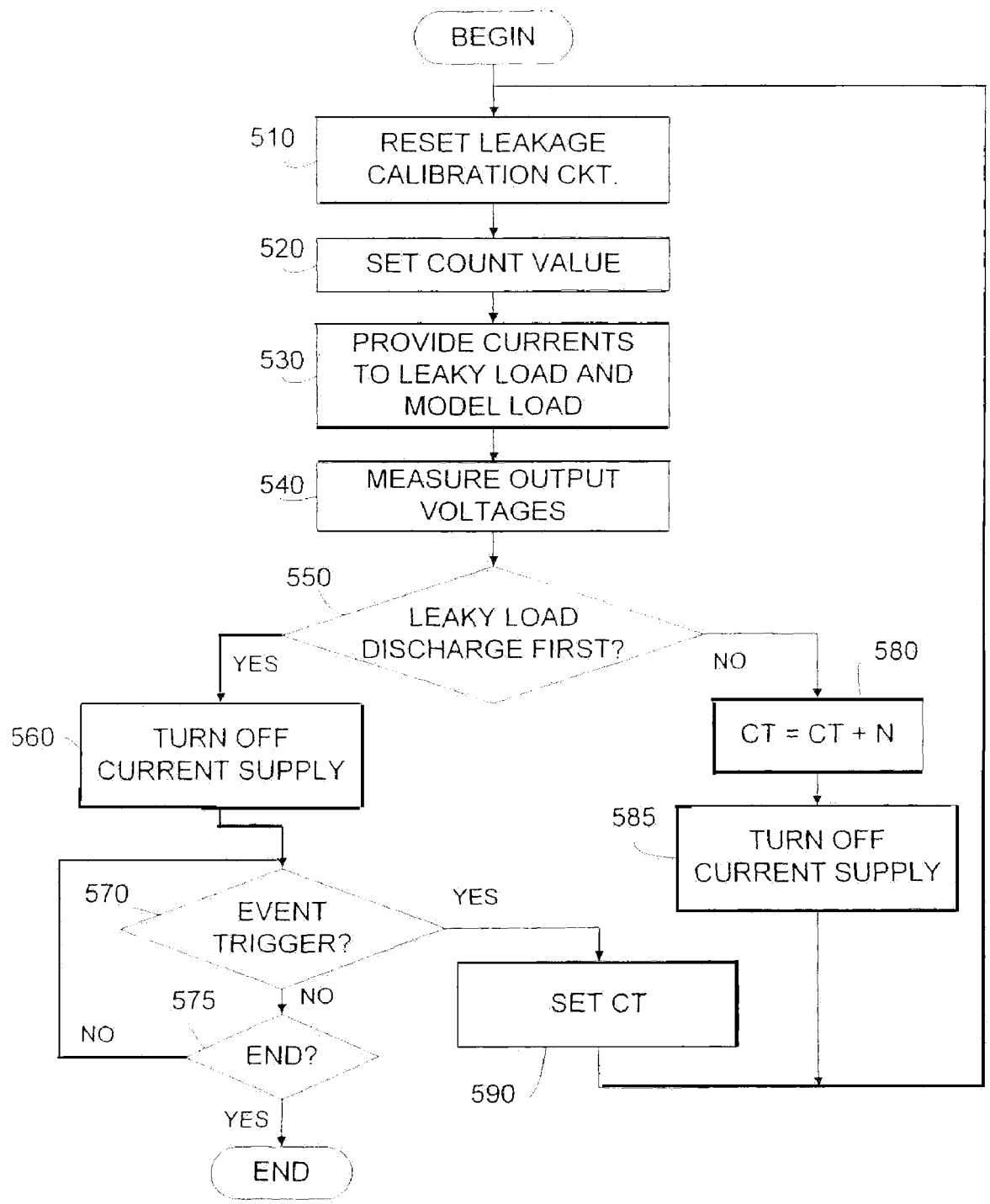
FIG. 6 shows an example of a calibration process for operating the controller of FIG. 5 when it is connected to one or more calibration circuits, such as, for example the leakage calibration circuit shown in FIG. 4, according to an embodiment of the disclosure.

FIG. 6 shows an example of a calibration process for operating the controller 420 when it is connected to one or more calibration circuits, such as, for example the LCC 400 discussed above, for a particular, respective, one or more IC functional blocks to be calibrated. While the following description of the example of the calibration process is provided with reference to the calibration circuit LCC 400 shown in FIG. 4, it is understood based on the foregoing that the calibration process may be equally used with other types of calibration circuits, without departing from the scope or spirit of the disclosure.

Referring to the process shown in FIG. 6, with particular references to the LCC 400 of FIG. 4, a particular leakage calibration circuit (such as, e.g., the LCC 400 of FIG. 4), which is representative of a particular IC functional block (not shown) to be calibrated, is selected for calibration and the LCC 400 is reset (Step 510). The LCC 400 may be reset as is known by those skilled in the art. A count value CT is set and provided to the counter 410 (Step 520). The count value CT is preferably the same count value used in, e.g., the sleep activation control (SAC) circuits of the actual IC functional blocks, including the particular IC functional block to be calibrated. While the step of resetting the LCC 400 (Step 510) is shown as preceding the step of setting a count value CT and forwarding the CT value to the LCC 400 (Step 520), the order of the steps may be switched.

Once the LCC 400 has been reset (Step 510) and a count value CT is set (Step 520), the LCC 400 may be activated by, for example, controlling the control logic CL1 to enable power to be supplied to the leaky load LLD and the model load ML1 (Step 530). After the power supply is enabled (Step 530), the leaky load LLD will draw a current $I_{LLD}$ through the node N2 at a discharge rate of $DR_{LLD}$. At the same time, the model load ML1 will draw a current $I_{ML}$ through the node N1 at a discharge rate of $DR_{ML}$. The voltage potential $V_{N1}$ at the node N1 will vary as a function of the discharge rate $DR_{ML}$. Further, the voltage potential $V_{N2}$ at the node N2 will vary as a function of the discharge rate $DR_{LLD}$.

The voltage potentials $V_{N1}$ and $V_{N2}$ are compared by the (leakage calibration circuit) LCC 400 to determine whether one of the voltages $V_{N1}$, $V_{N2}$, drops below the threshold voltage $V_T$ (Step 540). If the voltage $V_{N1}$, which corresponds to the voltage potential of the node N1, drops below the threshold voltage $V_T$ before the voltage $V_{N2}$, which corresponds to the voltage potential of the node N2 ("NO" at Step 550), then the count value CT is incremented by the integer value N (e.g., as discussed above with reference to FIG. 2) (Step 580). The power supply to the leaky load LLD and the model load ML1 may be turned off through the control of the control logic CL1 (Step 585) and Step 510 to Step 550 of the process may be repeated.

However, if the voltage $V_{N2}$ drops below the threshold voltage $V_T$ before the voltage $V_{N1}$ drops below the threshold voltage $V_T$ ("YES" at Step 550), then the power supply to the leaky load LLD and the model load ML1 may be turned off through the control of the control logic CL1 and the count value CT may be retained (Step 560). The retained count value CT may then be supplied to the sleep activation controller (SAC) for the particular IC functional block corresponding to the leaky load LLD. The SAC can then use the count value CT to determine when to place the particular calibrated IC functional block to sleep, such as, for example, after the IC functional block has been active for CT clock cycles without being enabled.

While the LLC 400 may have been turned off (Step 560), the controller 420 continues to monitor for an event trigger, such as, for example, a time trigger, a temperature trigger, or the like (Step 570). In this regard, the time trigger may include a calibration time schedule (such as, e.g., every second) during which a particular IC functional block may be active. The temperature trigger may include one or more temperature values (such as, e.g., a measured temperature near the IC functional block) at which the calibration may be activated. If an event trigger is determined ("YES" at Step 570), then a count value CT may be set (Step 590), otherwise the process stands in a standby mode ("NO" at Step 570, "NO" at Step 575), until an end signal is received, such as, for example, a power OFF signal ("YES" at Step 575).

The count value CT may be set (Step 590) to, e.g., a default count value CT that is associated with the particular leaky load LLD that is connected to the node N2. Further, the count value CT may be set (Step 590) on a basis of, for example, a leakage value of the particular IC functional block, a temperature value of the particular IC functional block, a size of the particular IC functional block, a voltage value of the IC functional block, historical data regarding the frequency of use of the particular functional block, or the like. The count value CT may be set so that the initial discharge rate $DR_{ML}$ for the model load ML1, which is connected to the node N1, is greater than the discharge rate $DR_{LLD}$ for the leaky load LLD, which is connected to the node N2. After the count value CT is set (Step 590), the calibration process is repeated.

Further, while the disclosure has been described in terms of particular embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the disclosure.

What is claimed is:

1. An integrated circuit, comprising:
    an input configured to receive a first current which is representative of a leakage current drawn by leakage in a portion of the integrated circuit; and
    a leakage calibrator configured to compare the first current to a current required to perform a switching operation and output a value indicative of the leakage, the leakage calibrator comprising:
        a model load coupled to a first node, the model load being configured to discharge a model leakage current at a first discharge rate;
        a leakage load coupled to a second node, the leakage load discharging the first current; and
        a controller coupled to the model load, the controller being configured to control the first discharge rate on a basis of said value.

2. The integrated circuit of claim 1, further comprising:
    a counter configured to receive a clock signal, wherein said value is determined by the counter.

3. The integrated circuit of claim 1, wherein said value is determined by a counter that is configured to receive a clock signal.

4. The integrated circuit of claim 1, further comprising:
    a sleep activation circuit that is configured to place a part of the integrated circuit in a sleep mode.

5. The integrated circuit of claim 4, wherein said value is provided to the sleep activation circuit.

6. The integrated circuit of claim 1, wherein said value is a numerical count.

7. The integrated circuit of claim 1, wherein the leakage calibrator further comprises:
    a first transistor coupled to the first node and a power supply; and
    a second transistor coupled to the second node and the power supply.

8. The integrated circuit of claim 1, wherein the model load comprises:
    a capacitor configured to store a charge; and
    an inverter configured to control the capacitor on a basis of a control signal.

9. A method for determining leakage in an integrated circuit, comprising:
    receiving a first current that is representative of a leakage current drawn by leakage in a portion of the integrated circuit, the first current being discharged by a leakage load;
    comparing the first current to a model leakage current required to perform a switching operation, the model leakage current being discharged by a model load at a first discharge rate;
    outputting a value indicative of the leakage: and
    controlling the first discharge rate on a basis of said value.

10. The method of claim 9, further comprising:
    determining the value based on a clock signal.

11. The method of claim 9, wherein said value is determined by counting a clock signal.

12. The method of claim 9, further comprising:
    placing a part of the integrated circuit in a sleep mode.

13. The method of claim 12, wherein the integrated circuit is placed in a sleep mode based on said value.

14. The method of claim 9, wherein said value is a numerical count.

15. The method of claim 9, further comprising:
    providing a first voltage potential to the model load via a first transistor coupled between the model load and a power supply; and
    providing a second voltage potential to the leakage load via a second transistor coupled between the leakage load and the power supply.

16. The method of claim 9, wherein the model load comprises:
    a capacitor configured to store a charge; and
    an inverter configured to control the capacitor on a basis of a control signal.

* * * * *